United States Patent [19]

Matuschik

[11] Patent Number: 5,886,879
[45] Date of Patent: Mar. 23, 1999

[54] SCREENING HOUSING FOR ELECTRONIC COMPONENTS

[75] Inventor: Peter Matuschik, Duisburg, Germany

[73] Assignee: U.S. Philips Corporation, New York, N.Y.

[21] Appl. No.: 923,129

[22] Filed: Sep. 4, 1997

[30] Foreign Application Priority Data

Sep. 6, 1996 [DE] Germany .................. 196 36 182.6

[51] Int. Cl.⁶ .................................................. H05K 9/00
[52] U.S. Cl. ........................ 361/818; 361/752; 361/800; 174/35 R
[58] Field of Search .................................. 361/800, 816, 361/818, 752, 728, 736; 174/51, 35 R, 35 GC; 439/109, 609, 607; 206/706

[56] References Cited

U.S. PATENT DOCUMENTS

| 4,092,698 | 5/1978 | Brefka ..................................... 361/752 |
| 4,912,604 | 3/1990 | Vaisanen ................................. 361/818 |
| 5,095,177 | 3/1992 | Johnson .................................. 361/818 |
| 5,436,802 | 7/1995 | Trahan et al. .......................... 361/816 |
| 5,546,278 | 8/1996 | Bethurum ................................ 361/737 |

Primary Examiner—Leo P. Picard
Assistant Examiner—Jayprakash M. Gandhi
Attorney, Agent, or Firm—Michael E. Marion

[57] ABSTRACT

The invention relates to a screening housing (10) for electrical components (11) arranged in the interior, which housing has a housing opening (13) which is closed with a lid (14) and which comprises a circumferential housing edge (15) which is flanged inwards, while outwardly projecting tongues (19) of the lid (14) defined by recesses (18) grip below inwardly extending projections (16) of the housing edge (15). To simplify such a screening housing construction, it is suggested that

- the tongues (19) of the lid (14) and the projections (16) of the housing edge (15) are arranged at two mutually opposed sides,
- the tongues (19) of the lid (14) lie in the same plane as the lid (14) itself,
- ledges (17) bent inwards and into a lower plane are provided for supporting the lid (14) next to the projections (16), and
- the two edges (14a, b) of the lid (14) not having tongues (19) grip below the two corresponding housing edges (15c, d).

6 Claims, 2 Drawing Sheets

SCREENING HOUSING FOR ELECTRONIC COMPONENTS

BACKGROUND OF THE INVENTION

The invention relates to a screening housing for electronic components arranged therein, with a housing opening which is closed with a lid and which comprises a housing edge which is flanged inwards, while outwardly projecting tongues of the lid defined by recesses grip below inwardly extending projections of the housing edge. The invention also relates to a method of screening electronic components arranged in such a housing.

A screening housing of the kind mentioned in the opening paragraph is known, for example, from US-PS 54 36 802. The known construction shows an arrangement for screening an electronic circuit which is provided on a substrate. The housing, which can be closed at its upper side by means of a lid, is here placed with its lower, open side on the substrate such that an electrical connection to the housing walls is achieved. The lid is then applied to the other open side of the housing, i.e. on the housing edge which is flanged inwards. For fastening, this lid is first laid on the housing edge such that the tongues, which lie in a plane below the lid plane, grip into corresponding recesses of the housing edge. Then the lid is so shifted that the tongues grip below corresponding projections of the housing edge. The lid accordingly lies on the housing in this construction and is retained by means of tongues which grip below the projections.

SUMMARY OF THE INVENTION

The invention has for its object to simplify the construction and mounting of the screening housing of the kind mentioned in the opening paragraph.

According to the invention, this object is achieved in that the tongues of the lid and the projections of the housing edge are arranged at two mutually opposed sides, the tongues of the lid lie in the same plane as the lid itself, ledges bent into a lower plane are provided for supporting the lid next to the projections, and the two edges of the lid not having tongues grip below the two corresponding housing edges.

An extremely flat construction of the housing is made possible thereby, because the lid no longer lies on the housing but lies recessed in the housing, i.e. no longer projects outside it. The lid thus disappears completely into the housing. Since the tongues defined by recesses lie in the same plane as the lid now, the lid itself is more stable and robust than in a construction in which the tongues are bent away from the plane of the lid. This means that the tongues retain their elasticity in a reliable manner also after repeated insertion and removal. In the construction according to the invention, tongues and projections are necessary only at two mutually opposed sides, since the two other edges of the lid not having tongues are passed below the corresponding housing edges. This means that the lid is a little longer than the housing opening at those sides where no tongues are present. The ledges bent into a lower plane provide a secure support for the lid.

In an embodiment of the invention, the tongues and/or projections are each provided with a bulging shape in the insertion direction of the lid. The distance between the support plane of the ledges and the lower side of the projections of the housing edge is generally such that the lid during its insertion is held through friction by the ledges on the one hand and the projections on the other. Providing the tongues with such a bulging shape considerably improves the retention of the lid between the corresponding surfaces of the ledges and the projections. Depending on the circumstances, such bulges may be present either on the tongues or on the ledges, or on the tongues and the ledges.

A further improvement of the retention is achieved in an embodiment of the invention which is characterized in the tongues and/or the projections are provided with plastically deformable catches in the locations which are in contact with one another. Such a locking of the lid in roof tile fashion implies that the catches are plastically deformed during retaining or shifting of the lid, so that a maximum pretensioning force is obtained.

In a further embodiment of the invention, the edges of the lid not having tongues are each provided with at least one locking stud. Such locking studs may be formed in a simple manner, for example, by bending upwards of a lid portion defined by two incisions. Such locking studs achieve that the lid cannot drop from its position after being inserted.

The invention further relates to a method of screening electrical components which are arranged on a printed circuit board surrounded by such a housing. Such a method is characterized in that the printed circuit board is inserted into the housing and is soldered to the side walls of the housing, the lid is inserted into the housing with its recesses over the projections such that it initially rests partly on the ledges, the lid is shifted in the insertion direction until the tongues grip below the projections, the lid edge lying in the insertion direction grips below the corresponding housing edge, and the opposed lid edge is snapped home into the housing opening, and the lid is shifted in opposite direction until the free lid edge grips below the corresponding housing edge.

Such a method provides a simple screening possibility for components which are accommodated on a printed circuit board inside the housing. If so desired, the lid may be readily detached in that the one lid edge is bent upwards after being shifted, whereupon the lid is pulled from the housing.

BRIEF DESCRIPTION OF DRAWINGS

In the drawing, FIGS. 1 to 3 diagrammatically show an embodiment of the object of the invention.

DETAILED DESCRIPTION OF A PREFERRED EMBODIMENT OF THE INVENTION

Figure 1:
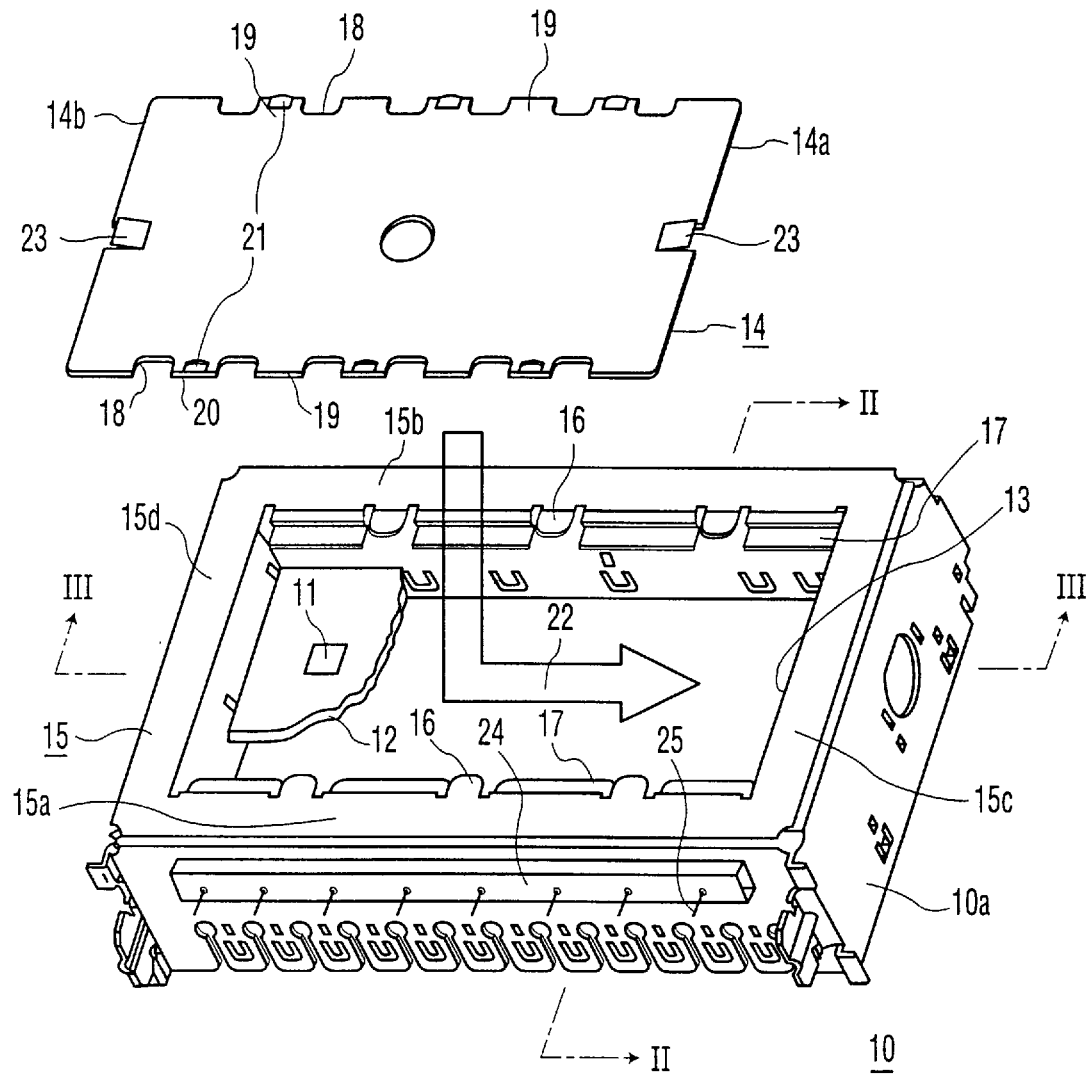
FIG. 1 shows a housing and an accompanying lid in perspective, exploded view.
Figure 2:
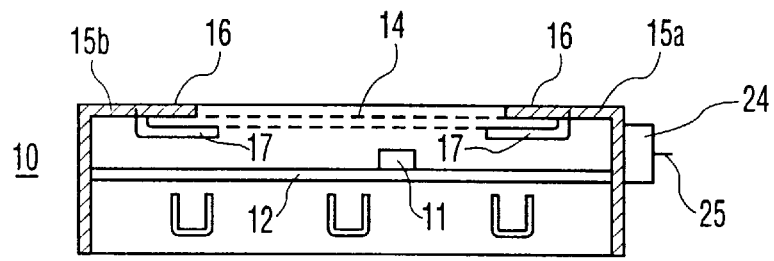
FIG. 2 is a cross-section taken on the line II—II in FIG. 1, with the lid indicated in broken lines.
Figure 3:
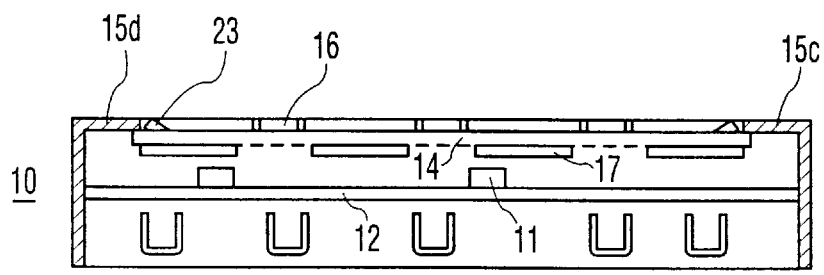
FIG. 3 is a cross-section taken on the line III—III in FIG. 1 with the lid shown in broken lines.

FIG. 1 shows a tuner housing 10 which is designed for the accommodation of a printed circuit board 12 provided with components 11. The board 12 is soldered by its edges to the side walls 10a inside the housing 10. The lower side of the housing is shown to be open in the embodiment and may be closed with a lid, which is not shown and which grips over the corresponding side walls 10a of the housing with tongues provided at the edge. The upper side of the housing 10 has a housing opening 13 which can be closed with a lid 14. The housing has a housing edge 15 which is flanged inwards and which has inwardly extending projections 16 at its two mutually opposed edges 15a, 15b. The projections 16 lie in the same plane as the housing edge 15. Ledges 17 which have been bent inwards into a lower plane below the plane of the projections 16 are visible next to the projections 16.

The lid 14 comprises tongues 19 which are defined by recesses 18 at two mutually opposed sides and which are provided with bulges 20 in the direction of the adjoining side edges of the lid 14. These bulges support plastically deformable catches 21.

The lid is somewhat greater than the housing opening 13 in longitudinal direction. To close the opening 13, the lid 14 is first inserted into the housing 10 with its recesses 18 over the projections 16 such that the one lid edge 14a can be passed under the one housing edge 15c in the direction of arrow 22. During insertion, the tongues 19 will grip below the projections 16, while the one lid edge 14a will grip below the housing edge 15c. The other housing edge 14b will thus be snapped home into the housing opening 13. The lid 14 is now fully supported on the ledges 17. Subsequently, the lid is shifted so far in opposite direction that the two lid edges 14a, 14b grip below the corresponding housing edges 15c, 15d. The lid finds itself locked then by means of locking studs 23, and the interior of the housing is screened from radiation by the lid. A contact strip 24 provided with connection contacts 25 is present at the exterior front housing wall 10a, said contacts being passed with insulation through the side wall and being connected to the printed circuit board 12. In prior-art tuners, such a contact strip lies inside the housing and accordingly occupies comparatively much space, which space is lost for the printed circuit board with the electronic components. Since the housing of this known tuner is closed with a lid which is provided with clamping bridges lying on the side walls, the contact strip cannot be moved to the outside in these tuners. The construction according to the invention thus has a further advantage in that the location of the contact strip on the outside increases the available interior space, which may accordingly be better utilized.

I claim:

1. A screening housing, electronic components arranged therein, with a housing opening which is closed with a lid and which comprises a housing edge which is flanged inwards, while outwardly projecting tongues of the lid defined by recesses (18) grip below inwardly extending projections of the housing edge, characterized in that the tongues of the lid and the projections of the housing edge are arranged at two mutually opposed sides, the tongues of the lid lie in the same plane as the lid itself, ledges bent inwards and into a lower plane are provided for supporting the lid next to the projections, and the two edges of the lid not having tongues grip below the two corresponding housing edges.

2. A screening housing as claimed in claim 1, characterized in that the tongues and/or projections are each provided with a bulging shape in the insertion direction of the lid.

3. A screening housing as claimed in claim 1, characterized in that the tongues and/or the projections are provided with plastically deformable catches in those locations which are in contact with one another.

4. A screening housing as claimed in claim 1, characterized in that the edges of the lid not having tongues are each provided with at least one locking stud.

5. A screening housing as claimed in claim 4, characterized in that the locking studs are each formed through bending upwards of a lid portion defined by two incisions.

6. A screening housing as claimed in claim 1, characterized by its use with a printed circuit board enclosed by the housing, the contact connections of said board being passed with insulation through a side wall and being connected to a contact strip which is provided on the outside of this side wall.

* * * * *